(12) United States Patent
Trotter et al.

(10) Patent No.: US 6,965,335 B1
(45) Date of Patent: Nov. 15, 2005

(54) METHODS FOR OUTPUT EDGE-BALANCING IN PULSE WIDTH MODULATION SYSTEMS AND DATA CONVERTERS USING THE SAME

(75) Inventors: Brian David Trotter, Austin, TX (US); Bruce Duewer, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/765,443

(22) Filed: Jan. 27, 2004

Related U.S. Application Data

(63) Continuation-in-part of application No. 10/662,788, filed on Sep. 15, 2003.

(51) Int. Cl.$^7$ .......................... H03M 1/66; H03M 3/00
(52) U.S. Cl. ...................................... 341/152; 341/143
(58) Field of Search .................................. 341/144, 152

(56) References Cited

U.S. PATENT DOCUMENTS

| | | | |
|---|---|---|---|
| 3,521,170 A | * | 7/1970 | Leuthold et al. ............ 341/143 |
| 5,008,675 A | * | 4/1991 | Toyomaki .................. 341/152 |
| 5,148,168 A | * | 9/1992 | Masuda et al. ............. 341/152 |

* cited by examiner

Primary Examiner—Howard L. Williams
(74) Attorney, Agent, or Firm—James J. Murphy; Thompson & Knight LLP

(57) ABSTRACT

A method of performing digital to analog conversion includes generating a pulse width modulated data stream and another pulse width modulated data stream, encoding patterns of the pulse width modulated data stream selected to minimize distortion in the another pulse width modulated stream caused by edges in the pulse width modulated data stream. The pulse width modulated data stream and the another pulse width modulated data stream are converted into an analog signal and another analog signal converting in corresponding digital to analog conversion elements and the analog signal and the another analog signal are summed to generate an analog output signal.

17 Claims, 17 Drawing Sheets

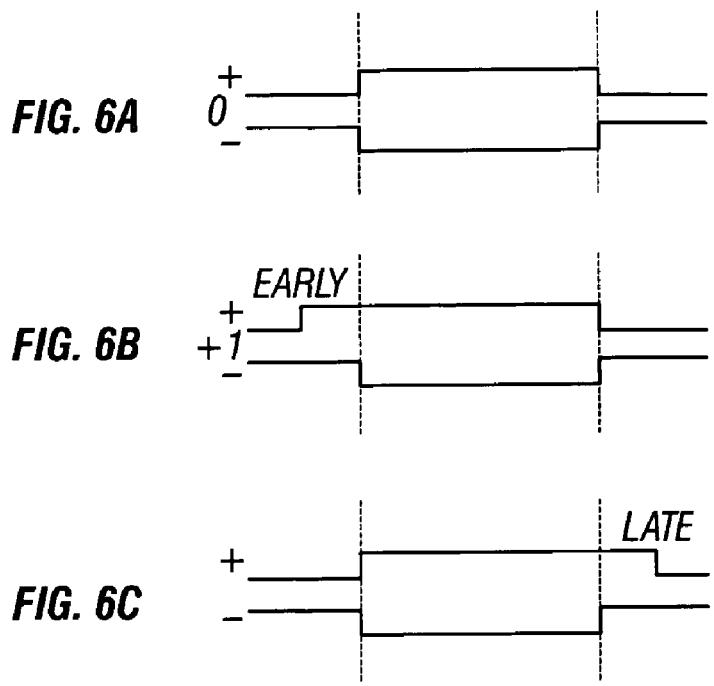
FIG. 6A
FIG. 6B
FIG. 6C
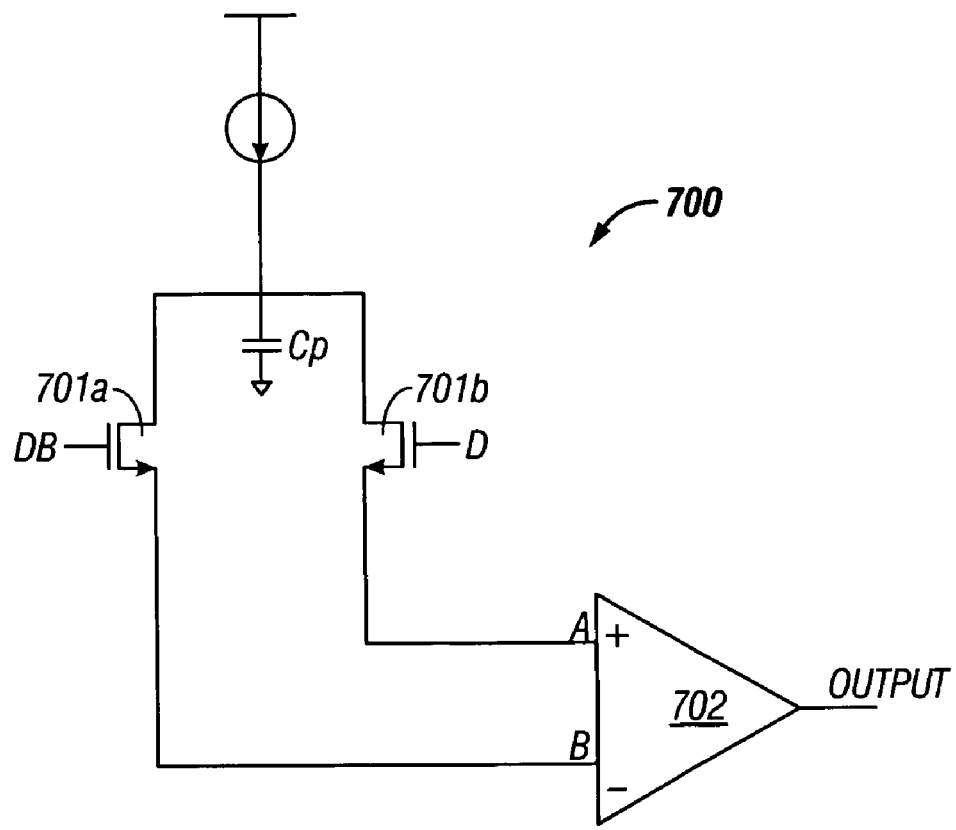
FIG. 7A

METHODS FOR OUTPUT EDGE-BALANCING IN PULSE WIDTH MODULATION SYSTEMS AND DATA CONVERTERS USING THE SAME

CROSS-REFERENCE TO RELATED APPLICATION

This application is a Continuation-In-Part of U.S. Ser. No. 10/662,788 filed on Sep. 15, 2003 by the same inventors. The application is also related to the following applications for patent which are incorporated herein by reference:

U.S. patent application Ser. No. 10/306,598, filed Nov. 27, 2002 by inventor Melanson, entitled "DATA CONVERTERS WITH DIGITALLY FILTERED PULSE WIDTH MODULATION OUTPUT STAGES AND METHODS AND SYSTEMS USING THE SAME", now U.S. Pat. No. 6,727,832; and Pending U.S. patent application Ser. No. 10/656,749, filed Sep. 5, 2003 by inventors Trotter, Duewer, and Melanson, entitled "DATA CONVERTERS WITH TERNARY PULSE WIDTH MODULATION OUTPUT STAGES AND METHODS AND SYSTEMS USING THE SAME", on which the issue fee has been paid.

FIELD OF INVENTION

The present invention relates in general to data converters utilizing pulse width modulation encoders, and, in particular, to methods for edge balancing in pulse width modulation systems and data converters using the same.

BACKGROUND OF INVENTION

Delta-sigma modulators are particularly useful in digital to analog and analog to digital converters (DACs and ADCS). Using oversampling, the delta-sigma modulator spreads the quantization noise power across the oversampling frequency band, which is typically much greater than the input signal bandwidth. Additionally, the delta-sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a loop filter, a quantizer, and a feedback loop coupling the quantizer output and the inverting input of the summer. In a first order modulator, the loop filter includes a single integrator or other filter stage while the loop filter in a higher order modulator has a cascade of a corresponding number of filter stages. Higher-order modulators have improved quantization noise transfer characteristics over those of lower order, but stability becomes a more critical design factor as the order increases. The quantizer can be either a one-bit or a multiple-bit quantizer.

In DAC applications, such as low out-of-band noise DACs, continuous-time output stages, such as current summers, which convert the quantized modulator output into a relatively smooth analog signal have a number of advantages over discrete-time output stages, such as switched capacitor output stages. For example, in DAC systems in which the modulator output is quantized into a large number of levels (e.g. sixty-four or more levels represented by eight or more bits), continuous-time output stages are relatively easy to design and construct. In addition, continuous-time output stages operating on a large number of quantization levels are relatively immune to jitter and the problem of sampling of far out-of-band energy. These advantages make continuous-time output stages the best choice for integration into large digital chips. With respect to smaller data converters and coder-decoders (Codecs), avoiding the sampling of high frequency energy allows for the simplification of the clock management scheme.

Despite their advantages, continuous-time output stages are also subject to significant drawbacks, such as a susceptibility to inter-symbol interference. (Inter-symbol interference or ISI in this case is usually caused by asymmetry in leading and trailing edges of the output signals from continuous time elements or from analog memory, in which each symbol is dependent on the prior one.) ISI can dominate the noise and distortion components in the output analog stream of a continuous-time data converter, even if a large number of continuous-time conversion elements operate on data samples with a large number of quantization levels. While ISI can be minimized using return to zero (RTZ) techniques, RTZ techniques generally cause increased circuit sensitivity to the characteristics of the controlling clocks.

Therefore, improved circuits and methods are required which allow continuous-time output stages to be utilized in such applications as DACs while minimizing ISI and at the same time reducing the effects of clock characteristics on circuit performance.

SUMMARY OF INVENTION

A method of performing digital to analog conversion includes generating a pulse width modulated data stream and another pulse width modulated data stream, encoding patterns of the pulse width modulated data stream selected to minimize distortion in the another pulse width modulated stream caused by edges in the pulse width modulated data stream. The pulse width modulated data stream and the another pulse width modulated data stream are converted into an analog signal and another analog signal converting in corresponding digital to analog conversion elements and the analog signal and the another analog signal are summed to generate an analog output signal.

By balancing edges, and in particular the late and early edges described below, the output noise caused by the switches in digital to analog conversion elements can be substantially reduced. Advantageously, the present inventive principles are applicable to any digital to analog converter using pulse width modulation encoders which drive digital to analog converters outputting into a summer. In particular, these principles are advantageously applied to continuous time data conversions systems, including those utilizing a delta sigma modulator for oversampling and re-quantization.

BRIEF DESCRIPTION OF DRAWINGS

For a more complete understanding of the present invention, and the advantages thereof, reference is now made to the following descriptions taken in conjunction with the accompanying drawings, in which:

FIGS. 6A–6C are diagrams illustrating exemplary techniques for generating the output patterns shown in FIGS. 5A–5C;

FIG. 7A is an electrical schematic diagram of an exemplary digital to analog conversion element suitable for illustrating one noise generation mechanism found in systems utilizing pulse width modulation encoders driving digital to analog conversion elements;

DETAILED DESCRIPTION OF THE INVENTION

The principles of the present invention and their advantages are best understood by referring to the illustrated embodiment depicted in FIGS. 1–12 of the drawings, in which like numbers designate like parts.

Figure 1A:
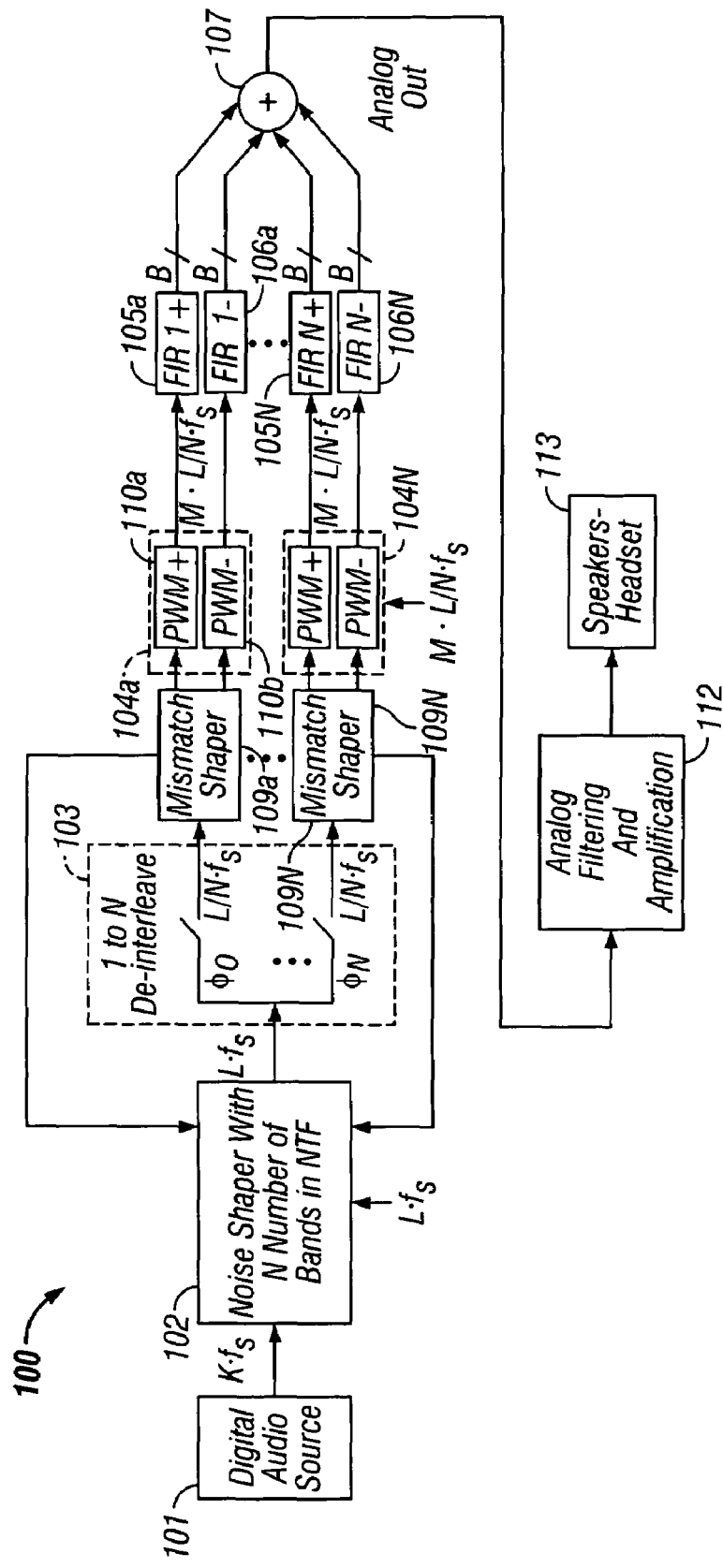
FIG. 1A is high level block diagram of an exemplary digital audio system including a digital to analog converter utilizing a delta-sigma modulator with multiple attenuation bands and de-interleaved pulse width modulators according to the inventive principles.

FIG. 1A is a high-level functional block diagram of an exemplary digital audio system 100 including an analog converter system suitable for demonstrating the principles of the present invention. For purposes of discussion, an audio application is described operating on digital audio from a source 101 such as a compact disk (CD) or digital versatile disk (DVD) player; however, the concepts described below can be utilized in a wide range of circuits and systems requiring digital to analog conversion. In system 100, the data output from digital source 101 is multiple-bit audio data having a base sampling frequency (rate) fs which is oversampled, for example, in an interpolation filter, by an oversampling factor K. For example, in the illustrated embodiment, the audio stream is output from digital audio source 101 with a base sampling frequency (fs) of 48 kHz with sixty-four times (64×) oversampling (i.e., K= 64).

System 100 is based on a multiple-bit noise shaper 102 (e.g. delta sigma modulator) with multiple attenuation bands in the noise transfer function (NTF). Noise shaper 102 will be discussed in detail further below; however, generally the NTF includes one attenuation band for attenuating noise in the signal passband and additional attenuation bands for attenuating noise, which would otherwise be demodulated by any non-zero mismatch between the following finite impulse response (FIR) stages 105a–105N and 106a–106N discussed below.

Noise shaper 102 in the illustrated embodiment outputs multi-bit quantized samples at an oversampling frequency L·fs, in which L is the oversampling ratio of noise shaper 102. The modulation index (MI) of noise shaper 102 is preferably set to ensure that full scale output quantization levels are not output to the following ternary PWM stages 104. However, in alternate embodiments, in which some level of the ISI in the output stream is tolerable, full-scale quantization levels are utilized.

Each multiple-bit sample output from noise shaper 102 is de-interleaved by 1 to N de-interleave circuitry 103 into a corresponding one of a set of N parallel ternary PWM stages, in which N is an integer greater than or equal to 1. Ternary Pulse width modulator (PWM) stages 104a–104N will be discussed in detail below. Generally, each ternary PWM stage 104a–104N includes two outputs (+ and −), in contrast to the single output utilized in conventional PWM stages. Each of the ternary PWM stages 104a to 104N therefore effectively operates on input samples at a rate of L/N·fs.

In the illustrated embodiment, each ternary stage 104a–104N is represented by a pair of PWM encoders 110a and 110b, respectively labeled PWM+ and PWM−. Each PWM encoder 110a and 110b receives a quantized data stream from an associated mismatch shaper 109a–109N. Mismatch shapers 109a–109N distribute the input codes between encoders 110a–110b, as discussed below, and provide feedback to noise shaper 102. The principles of the present invention are not limited to embodiments in which each ternary PWM stage 104a–104N includes two PWM encoders 110a–110b. For example, an alternate embodiment of PWM stages 104a–104N including three or more PWM encoders 110 allows each PWM output pulse to be represented by three or more output patterns. An increase in the number of PWM output patterns in turn allows the number of level output from noise shaper 102 to be proportionately increased. (The edge balancing techniques discussed below according to embodiments of the present inventive principles are applicable to both single output PWM encoding as well as multiple output PWM encoding.)

In the illustrated embodiment of system 100, each of ternary PWM stages 104a to 104N operates with an oversampling factor M and an oversampling clock signal at an oversampling frequency M·(L/N)fs. Each ternary PWM stage therefore outputs 2M number of N/(M·L) clock period long PWM patterns per each of representing (2M+1 levels) per sample received from de-interleave circuitry 103. In addition to the energy in the signal base band (approximately 0 to fs/2), each PWM stage 104a to 104N also outputs from each of two outputs significant energy at the fundamental frequency and harmonics of the PWM repeat rate of L/N·fs. Hence, each ternary PWM stage 104a to 104N output is followed by a digital-in, analog-out finite impulse response (FIR) filter with attenuation bands corresponding to these harmonics. Representative FIR filters 105a to 105N, 106a to 106N, in which filters 105a–105N filter the corresponding PWM+ outputs and filters 106a–106N filter the corresponding PWM– outputs are shown in FIG. 1A. The analog outputs from FIR filters are summed into output summer 106 to generate the analog output.

By this series of operations, system 100 ensures that the usage of all output elements 111a, . . . , N of FIR filters 105a–105N and 106a–106N (discussed below) is approximately the same, as guaranteed by multiple NTF zeros of delta-sigma noise shapers 102, (also discussed further below). In alternate embodiments, other techniques, such as independent delta-sigma modulators, may be used. In addition, by this construction of system 100, the edge rate of all of the filter elements 111a, . . . , N is also approximately equal. This result is due to a side effect of the fixed edge rate of combined delta-sigma modulators and pulse width modulators in general. Taken together, these two constraints remove much of the source for distortion in analog output stages.

Figure 1B:
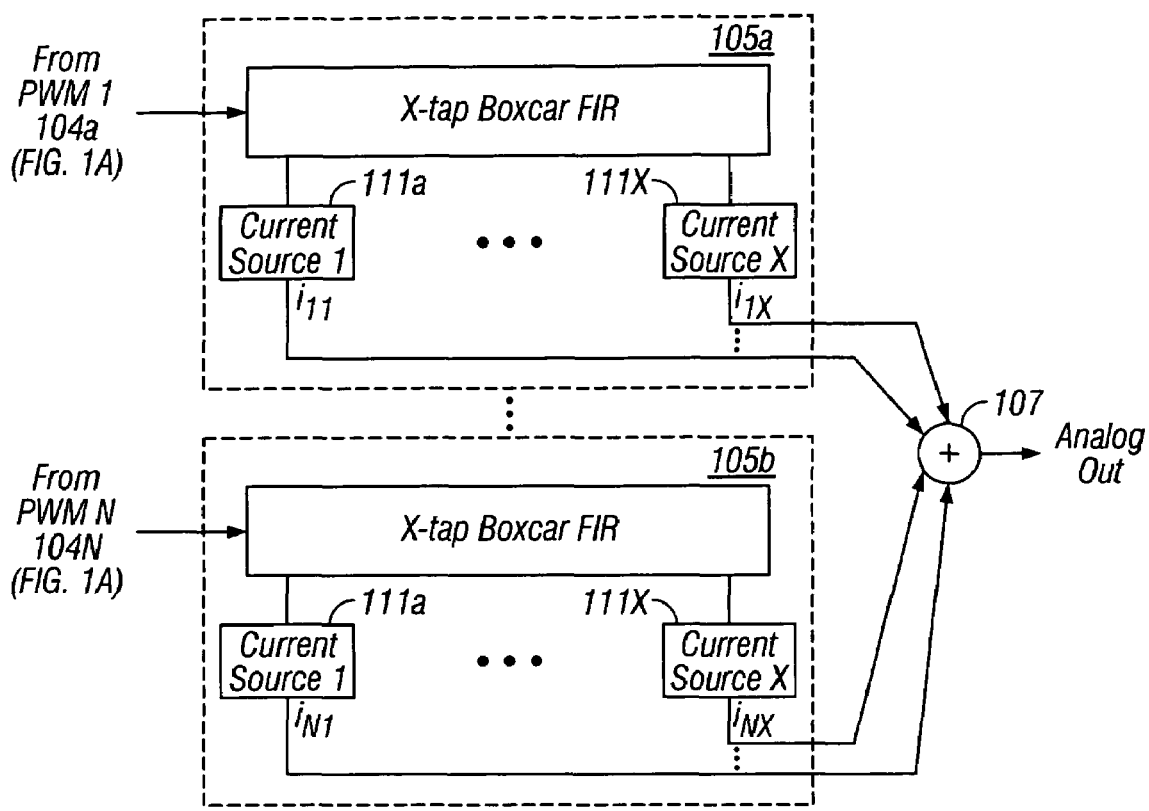
FIG. 1B is a more detailed block diagram of an exemplary digital-in, analog-out finite impulse response (FIR) filter suitable for use in the exemplary analog-in, digital-out FIR blocks shown in FIG. 1A.

FIG. 1B illustrates exemplary embodiments of digital-in, analog-out FIR filters 105a to 105N in further detail. The architecture of FIR filters 106a to 106N is the same. Each filter 105a to 105N includes a conventional FIR filter, such as a boxcar filter with simple coefficients, with X number of output taps. The length (number of stages) of each FIR filter 105a to 105N is greater than or equal to the width of the PWM pattern from the preceding PWM stage 104a to 104N, which introduces a notch in the filter output transfer function corresponding to the fundamental of the PWM repeat frequency. In other words, the length of each FIR filter 105a to 105N is proportional to the ratio of the output frequency of the FIR filter to the input frequency of the FIR filter. Longer FIR filters 105a to 105N (e.g. FIR filters with more stages) will attenuate more out of band energy at the cost of increased number of elements. An easy technique to significantly reduce out of band energy is to use FIR filters 105a to 105N with equal weights, with the number of taps equal to the PWM pattern length.

Each of the x number of filter taps, (in which x is an integer greater than one) is associated with a current source or similar single-bit digital to analog conversion elements, two of which are shown at 111a and for each filter 105a to 105N or 106a–106N. Current sources 111a, . . . , N are of a simple constructions, such as a voltage source and a resistor or transistors operating in a constant current region or cascoded transistors. The outputs from current sources are either single-ended or differential sources. In the illustrated embodiment, output summer 107 includes a current to voltage converter when single-bit digital to analog conversion is performed by current sources 111a, . . . , N. The currents can be equal, as in a boxcar filter, or unevenly weighted to improve the FIR filtering response. In alternate embodiments, filters other than boxcar FIR filters may be used. Advantageously, boxcar embodiments of FIR filter 105a to 105N and 106a to 106N, with equal taps are the simplest to implement and are adequate for most purposes.

In digital audio system 100 of FIG. 1A, the analog output signal generated by summer 107 is subject to additional conventional analog filtering and amplification by analog filtering and amplification circuit block 112. A headset or set of speakers 113 provides the audible output.

Figure 2A:
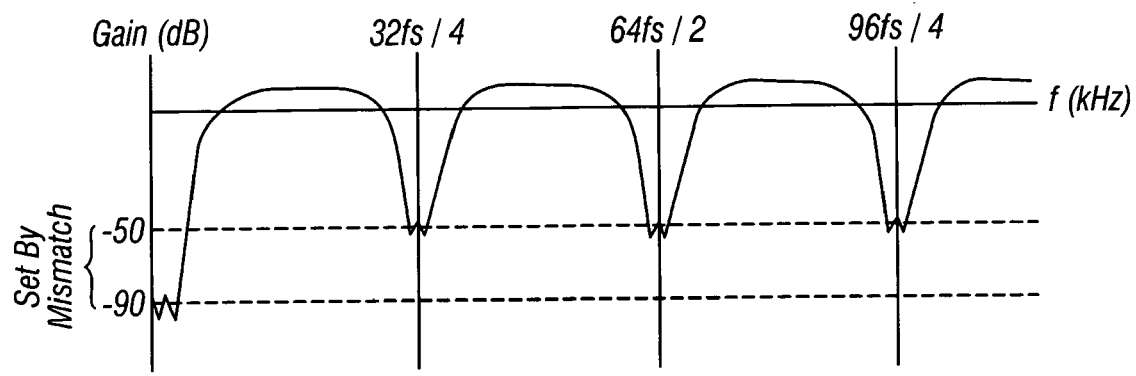
FIG. 2A is a gain versus frequency plot of the noise transfer function (NTF) of an exemplary delta-sigma modulator with four noise attenuation bands suitable for use in selected embodiments of the digital to analog converter of FIG. 1 utilizing four de-interleaved pulse width modulators.
Figure 2B:
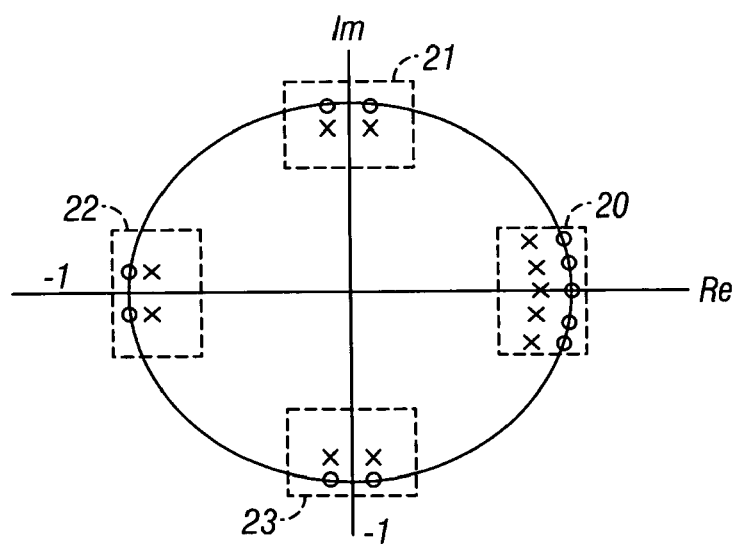
FIG. 2B is a plot in the z-plane of the poles and zeros of a delta-sigma modulator with multiple NTF noise attenuation bands corresponding to the noise attenuation bands shown in FIG. 2A.

The operation of noise shaper 102 for a by-four (i.e. N=4) de-interleaved system 100 is illustrated in FIGS. 2A and 2B. If N=4, noise shaper 102 outputs quantized samples that are split into four (4) sample streams each at a frequency of L·fs/4. In this example, noise shaper 102 outputs data samples at an oversampling frequency 128fs, and de-interleave circuitry 103 therefore splits the noise shaped data stream into four streams, each at a frequency of 32fs. Any mismatch between the following FIR filters 105a–105N and 106a–106N therefore demodulates the noise in the modulator bands 128·fs/4, 128·fs/2 and 128·3fs/4 (respectively 32fs, 64fs and 96fs). Advantageously, the use of a PWM stage 104a to 104N in each output increases the effective matching accuracy of the following DAC elements, since the effect of the output mismatch is reduced by the number of slots in the PWM up-sampling.

As shown in FIG. 2A, the noise exposed to any non-zero mismatch between FIR filters 105a–105N and 106a–106N is minimized by three additional attenuation bands included in the noise transfer function (NTF) of noise shaper 102 about the frequencies 32fs, 64fs and 96fs along with the noise attenuation band at the signal baseband. The difference between the average level of attenuation in the signal band and the average level attenuation at the frequencies 32fs, 64fs, and 96fs depends on the mismatch between the following PWM stages 104a to 104N. If more mismatch exists, then more modulator noise is demodulated in the frequencies bands about 32fs, 64fs and 96fs, and the more attenuation in the modulator NTF around the frequencies 32fs, 64fs and 96fs is required. However, an increase in attenuation at the frequencies 32fs, 64fs and 96fs results in a decrease in attenuation in the signal band. (Generally, the area below the x-axis of FIG. 2A must equal the area above the x-axis.) Thus, a balancing must be made between the global noise shaping of the NTF across the modulator output frequency spectrum and local attenuation levels around 32fs, 64fs, and 96fs.

An NTF in noise shaper 102 with a given difference between the average attenuation level in the signal band and the average attenuation about the frequencies 32fs, 64fs and 96fs needs to be produced. A noise shaper topology which produces a one set of poles-zero pairs for setting the NTF signal band attenuation and sets of fewer poles about the frequencies 32fs, 64fs and 96fs is required. A z-plane plot of the poles and zeros characterizing one such noise shaper is shown in FIG. 2B. In this example, an $11^{th}$ order noise shaper is characterized, which includes a first set 20 of five (5) pole-zero pairs that define the shape of the low frequency (signal band) noise attenuation of the NTF. In the illustrated embodiment, pole-zero pair set 20 includes four (4) pole-zero pairs at Butterworth locations and one (1) real pole-zero pair. Three additional sets 21, 22, and 23 of poles respectively define the shape of the noise attenuation bands about the frequencies 32fs, 64fs, and 96fs. The number of poles and zeros in each set 20–23 may vary between embodiments, depending on the desired noise shaping and the tradeoff between the attenuation level in the NTF signal band and the attenuation levels in the 32fs, 64fs, and 96fs frequency bands of the NTF. In FIG. 2B, the NTF zeros at 32fs, 64fs and 96fs are split along the unit circle in the z-plane. In alternate embodiments, these zeros may remain un-split (co-located) to reduce the amount of hardware required to implement noise shaper 102.

Exemplary delta sigma modulator (noise shaper) topologies, which generate multiple attenuation bands in the NTF and which are suitable for use in noise shaper 102 are described in copending and coassigned patent application entitled "DELTA-SIGMA MODULATION CIRCUITS AND METHODS UTILIZING MULTIPLE NOISE ATTENUATION BANDS AND DATA CONVERTERS USING THE SAME" (U.S. Serial No. 0/191,016) incorporated herein by reference. For example, the z-plane pole-zero plot shown in FIG. 2B may be achieved by using the de-interleaved modulator topology 200 shown in FIGS. 2C and 2D, and discussed briefly below. Alternatively, a feedforward design may be utilized having five filter stages with a transfer function of $1/(1-Z^{-1})$, and associated feedback loops, which place poles and zeros about the Z=0 point and a pair of filter stages with a transfer function of $1/(1-Z^{-4})$, and associated feedback loops, which place poles and zeros about the z-plane points Z=1, −1, j and −j. A feedback modulator may be used in other embodiments, although a feedback topology requires more precise coefficients and additional hardware. A general discussion of delta-sigma modulator topologies, including feedforward designs, is found in publications such as Norsworthy et al., *Delta-Sigma Data Converters, Theory, Design and Simulation*, IEEE Press, 1996).

In exemplary modulator topology 200, shown in FIG. 2C, the local noise shaping at the frequencies fs/4 (z-plane point Re=0, Im=j), fs/2 (z-plane point Re=−1, Im=0) and 3fs/4 (z-plane point Re=0, Im=−j) are implemented using four respective sets of independent loop filter stages 201a–201d, the outputs of which are de-interleaved in time by switch ("SW") 202 into the main noise shaping loop 209 discussed below. Each set of independent filter stages 201a–201d, shown in further detail in FIG. 2D, includes a pair of filter stages 203a and 203b, corresponding feedforward stages 204a and 204b with coefficients C, and $C_2$ for setting the local poles, and a feedback loop 205 (with one delay $Z^{-1}$ and gain g1') and summer 206 for setting the local zeros. (The structure of each independent filter stage 201a–201d may vary from a single filter stage 203 to three or more filter stages 203 and include more than one feedback loop, depending on the desired number and location of the local poles and zeros). The outputs from gain stages 204a–204b of independent loop filter stage 201a–201d are de-interleaved by a corresponding set of switches (SW) 207a–207b into the modulator output summer 208 of FIG. 2C.

Figure 2C:
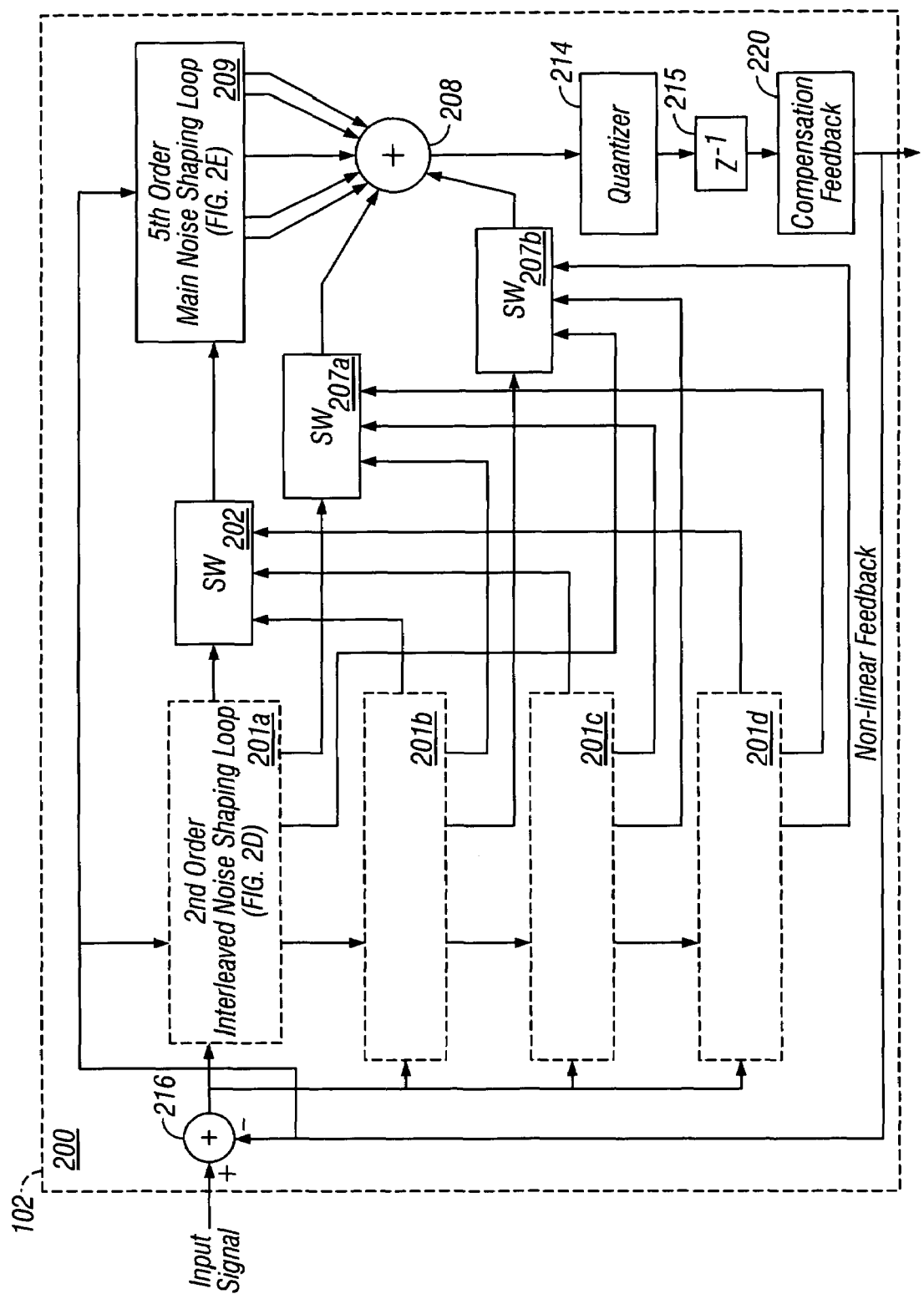
FIGS. 2C–2E are block diagrams of exemplary feedforward delta-sigma modulators suitable for producing the pole-zero placements shown in FIG. 2B.
Figure 2D:
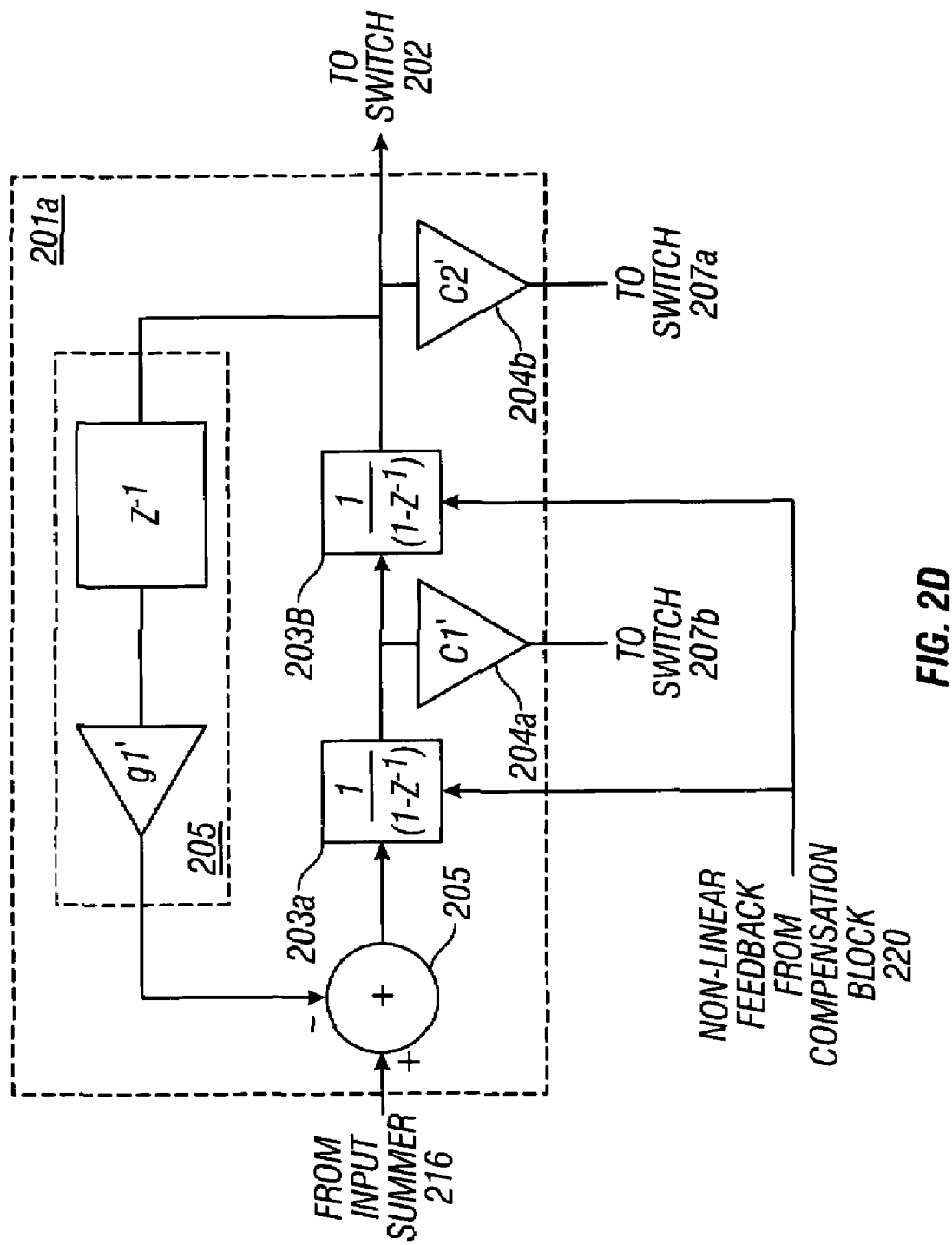

The global (baseband) noise shaping about DC ((direct current or zero frequency) (z-plane point Re=0, Im=0)) is characterized by a fifth ($5^{th}$) order, main (shared) noise shaping loop 209 as shown in FIG. 2C. Main noise shaping loop 209 is shown in further detail in FIG. 2E and includes five (5) global filter stages 210a–210e and associated feedforward stages 211a–211e with respective coefficients $C_3$–$C_7$ feeding-forward into output summer 208 (see FIG. 2C). (The number and/or the Z-domain responses of global filter stages 210a–210e may also vary from embodiment to embodiment depending on the desired number and locations of the global pole-zero pairs in the NTF.) Feedback loops 212a–212b (including a gain of g2' and g2" and a delay $Z^{-1}$) and summers 213a–213b are shown for moving the global noise shaping zeros on the z-plane unit circuit away from the DC point (Re= 1, Im=0).

While the energy of each PWM stage 104a to 104N generally tracks the input energy over time (e.g., the first integral of the output energy tracks the first integral of the input energy), apparent distortion in the PWM output occurs because the moments of the PWM output energy vary with different PWM patterns (e.g., the values of the second and higher order integrals of the PWM output energy do not track the values of the higher order integrals of the input energy). In particular, the location of the second or higher moment for a given PWM output pattern depends on the specific digital word being converted and the corresponding number of logic high and logic low slots in the pattern as well as the distribution of those slots across the time period of the pattern. The distribution of the slots in each pattern is affected, for example, by the technique used to generate that pattern (e.g., grow right, grow left, etc.).

Figure 2E:
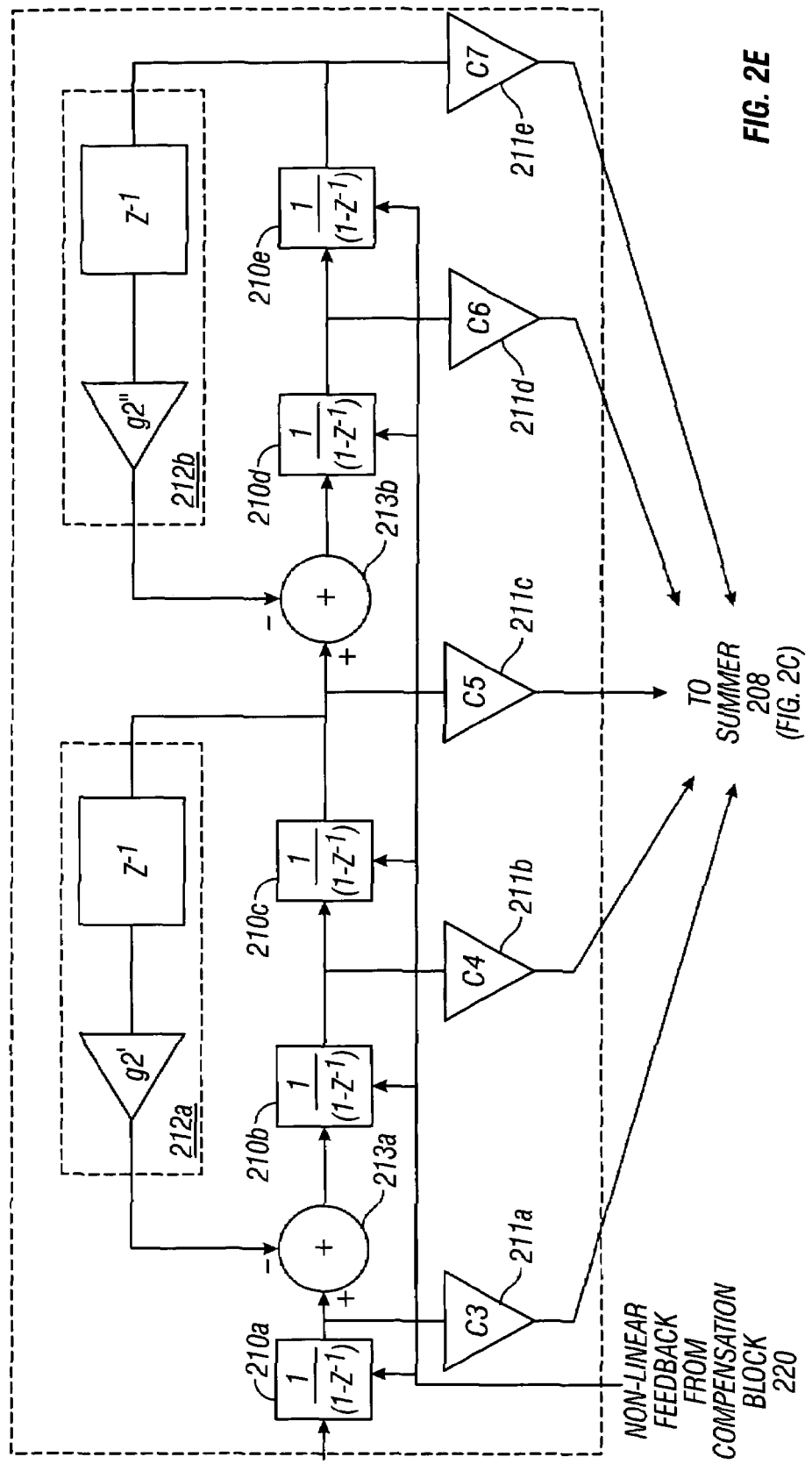

In delta-sigma modulator 102 of FIG. 2C, a feedback compensation block 220 is included at the output of quantizer 214 to provide nonlinear feedback to the integrator stages 203a–203b of second order loop filters 201 (see FIG. 2D) and/or integrator stages 210a–210e of fifth order loop filter 209 (see FIG. 2E). The nonlinear feedback provided by feedback compensation block 220 is described in incorporated U.S. Pat. Nos. 6,150,969 and 5,815,102, incorporated herein by reference. Generally, correction factors are fed back from feedback compensation block 220 to integrator stages 203a–203b and 210a–210b of delta-sigma modulator loop filters 201a to 201d and 209. By selectively correcting the inputs to the corresponding integrator stages, the moments of the data into the inputs of the following PWM stages 105a to 105N are varied. In turn, the moments of the PWM outputs are corrected to reduce distortion, which would otherwise result from time varying output energy moments. For example, to correct for variations in the second moment in a given PWM output pattern, nonlinear correction factors are fed back to at least the second integration stages of the delta-sigma modulator loop filters 201a to 201d and 209.

Returning to FIG. 2C, a multiple-level quantizer 214 and a delay element ($Z^{-1}$) 215 preferably generate the output of modulator 200. The resulting output signal is fed-back to the inverting input of the modulator-input summer 216 to close the delta-sigma loop. By de-interleaving between independent sets of filter stages 201a–201d, each set of filter stages 201a–201d is contributing to the input of summer 208 at one-quarter (¼) of the sampling rate fs at the modulator input. Consequently, the poles and zeros set by filter sets 201a–201d are translated to the z-plane points shown in FIG. 2B.

Continuing with the by-four de-interleaved (N=4) embodiment of the digital-to-analog converter of digital audio system 100 of FIG. 1, the four 32fs quantized sample streams output from de-interleaving circuitry 103 are respectively passed to four PWM stages 104a to 104N. In this example, each PWM stage 104a to 104N performs an eight-times (8×) oversampling from a 256fs oversampling clock signal (i.e. M=8). The resulting PWM encoded output pulse streams overlap in time, as shown in FIG. 3.

Figure 3:
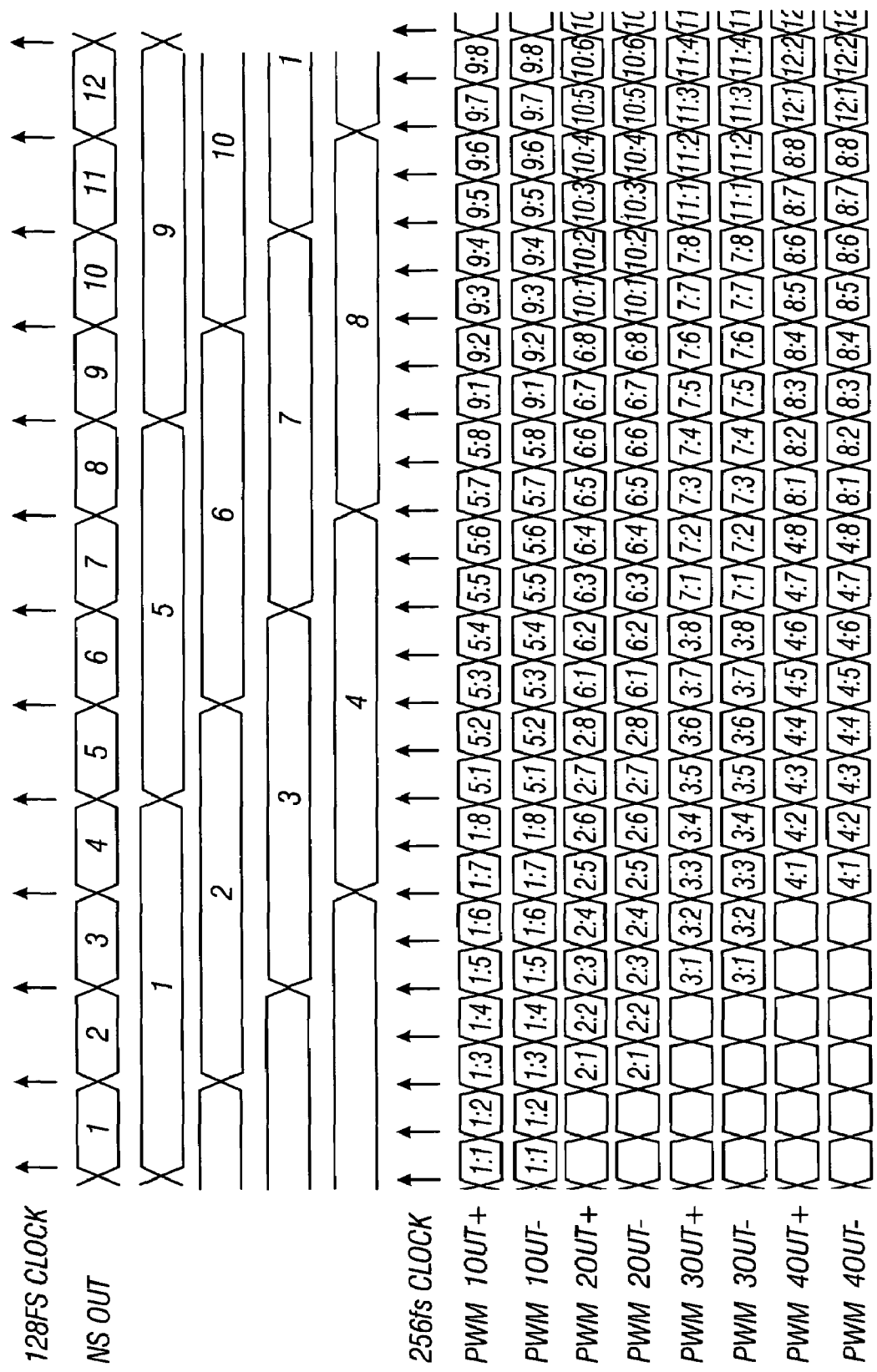
FIG. 3 is a timing diagram illustrating the signal timing of representative operations of the delta-sigma modulator and ternary pulse width modulators shown in FIG. 1 for the exemplary by-four de-interleaved pulse width modulator embodiment.
Figure 4:
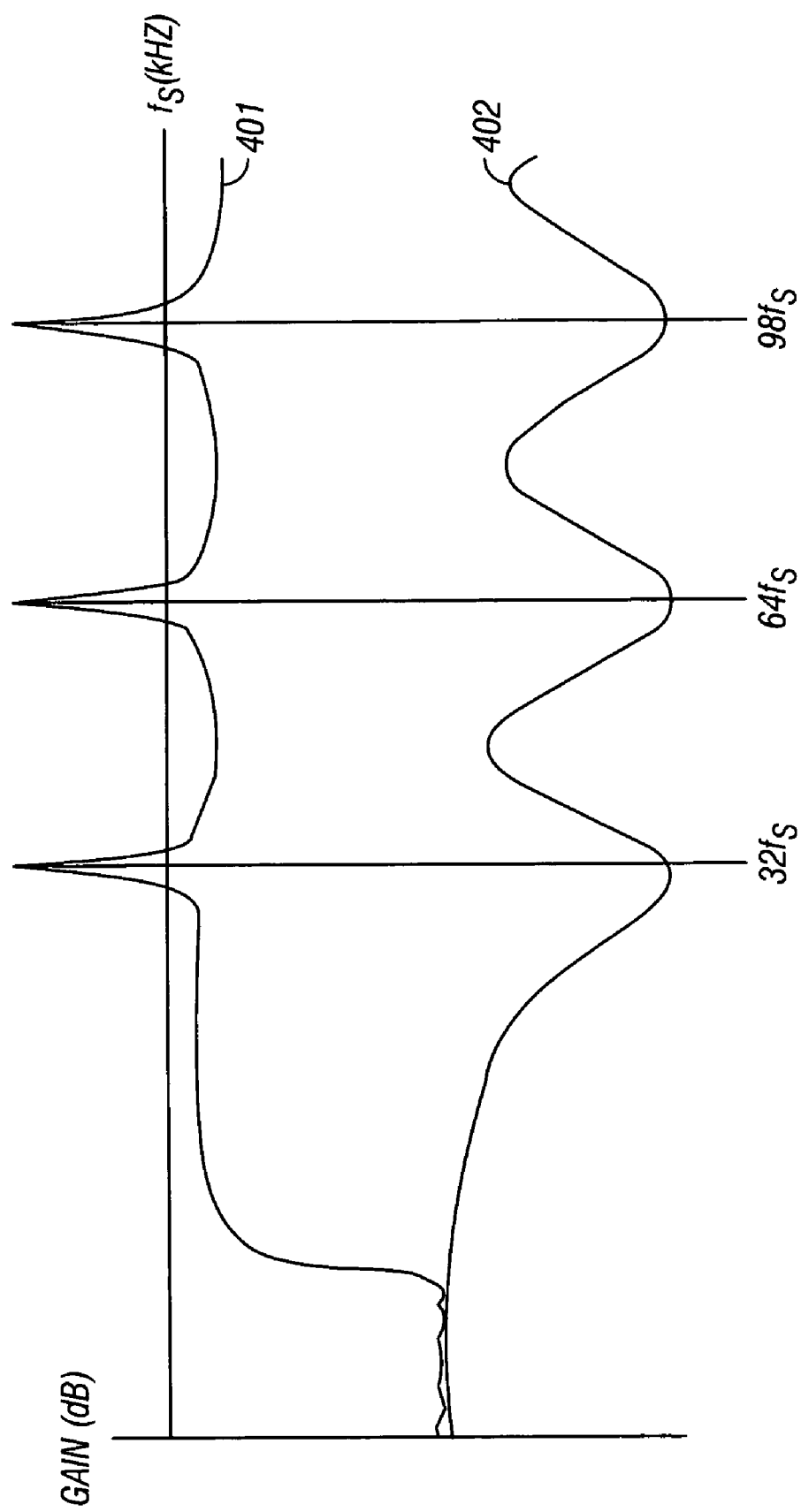
FIG. 4 is a gain versus frequency plot of the output of a selected one of the pulse width modulators of FIG. 1 for the exemplary by-four de-interleaved PWM and the response of the associated finite impulse response output filter.

FIG. 3 is a timing diagram depicting the conversion of an arbitrarily selected number of multiple-level quantized samples output from noise shaper 102 at the 128fs oversampling frequency into multiple PWM streams at the 256fs oversampling frequency. In FIG. 3, sixteen (16) representative bits or samples (1–16) from the output of noise shaper 102 are shown by the trace labeled NSOUT. After a by-four interleave, each ternary PWM stage 104a to 104N operates on a new operand (sample) at the 32fs rate as respectively shown by the overlapping streams labeled $PWM_1$, $PWM_2$, $PWM_3$, and $PWM_4$.

For an eight-times oversampling, each ternary PWM stage 104a to 104N encodes each corresponding sample received at the 32fs oversampling frequency into two PWM encoded patterns (i.e. + and −), each corresponding to eight (8) periods of the 256fs oversampling clock signal, as represented by the streams labeled $PWM_{1OUT+}$, $PWM_{1OUT-}$, $PWM_{2OUT+}$, $PWM_{2OUT-}$, $PWM_{3OUT+}$, $PWM_{3OUT-}$, $PWM_{4OUT+}$, and $PWM_{4OUT-}$ in FIG. 3. For example, the $PWM_{1OUT+}$ and $PWM_{1OUT-}$ streams together represent the output samples 1, 5, 9, and 13 from noise shaper 102, after by-four de-interleaving by de-interleaving circuitry 103 and eight-times oversampling by the corresponding PWM stages 104a to 104N.

The pairs of PWM encoded bitstreams $PWM_{1OUT+}$ and $PWM_{1OUT-}$, $PWM_{2OUT+}$ and $PWM_{2OUT-}$, $PWM_{3OUT+}$ and $PWM_{3OUT-}$, and $PWM_{4OUT+}$ and $PWM_{4OUT-}$, are offset in time by two periods of the 256fs PWM oversampling clock (or equivalently one period of the 128fs noise shaper oversampling clock). Each of these time-overlapped streams modulates energy in the signal baseband of approximately 0 to fs/2 along with significant energy at the harmonics of the repeat frequency 32fs (e.g. 32fs, 64fs, 96fs, and so on) as shown in trace 401 of the output gain versus frequency plot of FIG. 4. Consequently, each of the four ternary PWM stages 104a to 104N is associated with two output FIR filters 105a to 105N and 106a–106N with a response generally shown by trace 402 in FIG. 4. In particular, the response of each FIR filter 105a to 105N has notches about the harmonics of 32fs corresponding to the peaks in the output response of the corresponding PWM stage 104a to 104N at the same frequencies. FIR response 402 is achieved, for example, by using 8 stage boxcar FIR filters with simple coefficients.

In an embodiment with four digital-in, analog-out FIR filters 105a to 105N and 106a–106N, each having a 8 stage boxcar filter, sixty-four analog outputs are provided into output summer 106. The sixty-four analog outputs overlap in time and are matched in usage and transition rate (transition density). The result is a continuous-time, analog output with minimal noise and distortion due to ISI. Advantageously, the structure is such that all DAC elements have the same edge rate and same duty cycle of use. To a significant degree, this advantage causes the cancellation of all distortion and noise products.

Figure 5A:
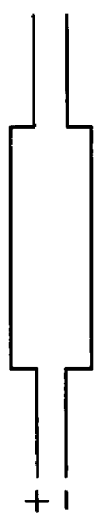
FIGS. 5A–5C are diagrams of exemplary output patterns available from a multiple-output PWM stage embodying the present inventive principles.

As shown in the example of FIG. 5A, each ternary PWM stage 104a–104N generates two PWM output patterns (+ and −) for each sample received from de-interleave circuitry 103 and the corresponding mismatch shaper 109a–109N. Advantageously, by encoding each input sample into two output patterns, the number of available PWM output levels per input sample is almost doubled, relative to conventional single-output PWM stages, without an increase in the PWM oversampling clock rate. For example, a conventional PWM encoder with a single output which encodes each input sample into an eight (8) slot wide PWM pattern, is limited to nine (9) possible output levels per output pattern corresponding to nine (9) possible input levels. In contrast, embodiments of PWM stages 104a–104N outputting two eight-slot patterns per input sample encode each input sample into an output pattern representing one of seventeen (17) possible levels. In turn, the input resolution (number of levels per input sample) into PWM stages 104a–104N may be increased to seventeen possible input levels to further increase the noise suppression provided by noise shaper 102.

The exemplary dual PWM output pattern signal shown in FIG. 5A represents a mid-level input value for purposes of the present discussion. In this case, the active slots of the each PWM output pattern are defined as the logic high level slots and the inactive slots as the logic low slots. Thus, for an embodiment in which each input sample is represented by two eight (8) slot wide PWM patterns, the midlevel PWM output value is represented by four (4) active slots and four (4) inactive slots. In the example shown in FIG. 5A, the + pattern includes two (2) inactive slots, followed by four (4) active slots and two (2) inactive slots while the − pattern includes two (2) active slots, followed by four (4) inactive slots and two (2) active slots. In other words, in the illustrated embodiment the + and − outputs for a midlevel input to a given PWM stage 104a–104N are nominally complementary waveforms which nominally sum to zero in analog summer 106. Other patterns representing the midlevel input level are possible in alternate embodiments.

As the input samples change, the PWM encoded output value (duty cycle) of one or both of the + and − output patterns changes (i.e. the number of active slots for the total output pattern represented by the + and − outputs increases or decreases such that the overall PWM encoded output value changes accordingly).

Figure 5B:
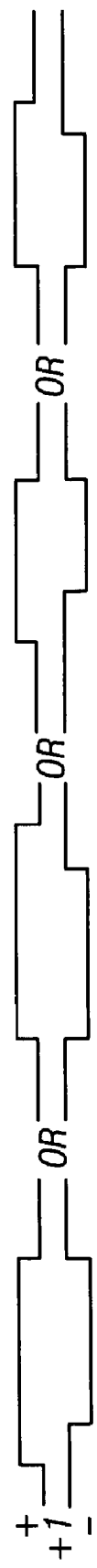
Figure 5C:
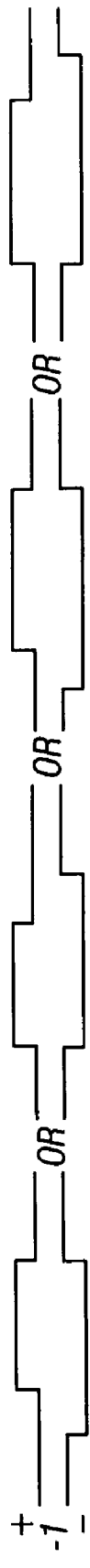

FIGS. 5B–5C demonstrate that a number of different techniques may be utilized for varying the output level (duty cycle) of a dual PWM output signal in response to a change in the input value. Generally, when the input value changes, either the +PWM output, the −PWM output, or both the + and −PWM outputs vary accordingly. Furthermore, for a given one of the + and − outputs, the output signal duty cycle may be varied by either varying the right or left edge of the output pattern relative to the mid-level pattern of FIG. 5A.

For odd-valued variations from the mid-level PWM pattern of FIG. 5A, one edge of one of the + or − patterns must differ from the other pattern by one active slot. However, if only the + output pattern or only the −PWM pattern is always varied for odd-valued input sample values, then distortion will result in the ultimate analog output due to mismatch between elements in filters 105a–105N and 106a–106N and summer 107. Therefore, mismatch shapers 109a–109N are included in digital audio system 100, as shown in FIG. 1, which, for odd inputs into PWM stages 104a –104N, unevenly split the input samples from de-interleave circuitry 103 into the following PWM encoders 110a and 110b and consequently distribute the output pattern variations between the + and − output patterns. For example, if the input value from de-interleave circuitry 103 represents an output level of +3, the current mismatch shaper 109a–109N may distribute an input value of +1 to PWM encoder 110a of the following PWM stage 104a–104N and an input value of +2 to the associated PWM encoder 110b. During the subsequent processing of the input data stream, the same mismatch shaper 109a–109N reverses the process for the next received input value representing an output level of +3 to that mismatch shaper 109a–109N, such that the corresponding PWM encoders 110a and 110b respectively receive +2 and +1 values.

For even-valued variations from the midlevel PWM pattern, active slots are added or subtracted from both the + and − output patterns to avoid mismatch. For example, to increase the overall PWM output level by +2, then the number of active slots for both the + and − output patterns is increased by +1. Specifically, the current mismatch shaper 109a–109N evenly splits the input value from deinterleave circuitry 103 into two equal values for input into the following PWM encoders 110 and −110b.

In addition to determining whether to vary the + or − output patterns, a determination must also be made as to the position in the selected pattern at which active slots are to be added or subtracted. For example, in a "grow left" scheme, the first +1 added to the left edge of the pattern first, and thereafter variations are made by alternating between the right and left edges. In a "grow right" scheme a first +1 is added to the right edge, and thereafter variations are made by alternating between the left and right edges. In other words, an edge may be moved to be either early or late relative to its position at the midlevel reference position, as illustrated in FIGS. 6A–6C.

FIG. 6A shows the midlevel PWM output value as a reference. In FIGS. 6B and 6C, the +PWM output pattern (arbitrarily chosen for discussion purposes; the same process may alternatively be applied to the −PWM pattern) is increased by one (1) active slot to increase the overall output value by one (+1). In particular, in the case shown in the FIG. 6B, the additional active slot is added with the grow left technique such that the left edge of the + pattern is early with respects to the corresponding left edge in the reference midlevel + pattern of FIG. 6A In FIG. 6C, the additional active slot is added with the grow right technique such that the right edge of the + pattern is late with respects to corresponding edge in the reference midlevel + pattern of FIG. 6A.

The principles of the present invention embody a recognition that utilizing multiple PWM encoders each driving a DAC element (either continuous-time or discrete time) into an analog summer introduces a certain level of noise in the summer output. Generally, when the output of a given PWM encoder transitions from one voltage to another, the resulting switching in the following DAC elements causes interference noise between the different data paths. This noise is then summed by the summer into the analog output. FIG. 7A generally illustrates the noise generation mechanism in an exemplary generalized DAC element 700.

Figure 7B:
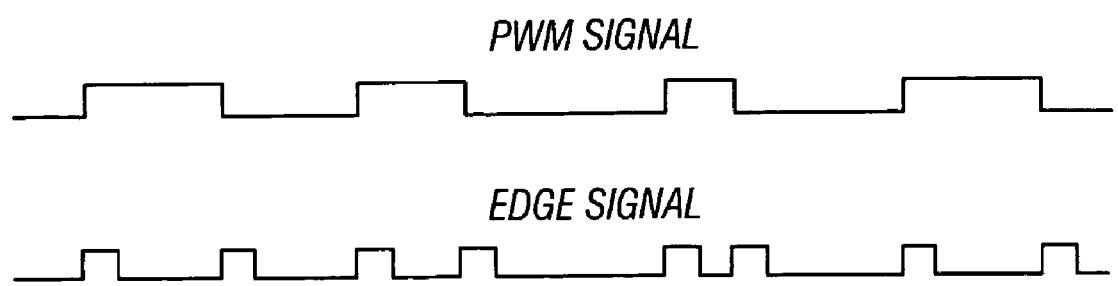
FIG. 7B is a diagram illustrating the generation of edge signals from a pulse width modulated signal.

As shown in FIG. 7A, the input data D and DB are complementary edge signals generated from a PWM encoded data stream, as shown in the diagram of FIG. 7B. The edge signals represent the first difference of the PWM signal, i.e. the difference between the PWM signal and the PWM signal shifted one cycle in time. The edge signals D and DB overlap slightly to insure proper operation of the circuit, therefore switches 701a and 701b do not turn off completely. Cp represents the parasitic capacitance. Consequently, during the overlap period, any difference in voltage at nodes A and B to operational amplifier 702 causes signal-dependent current to flow in one direction or another. The difference between nodes A and B can be substantial, since nodes A and B do not fully settle. The signal dependent current is only present at the edges in the PWM signal, and results in interference which can couple into another signal path.

Figure 7C:
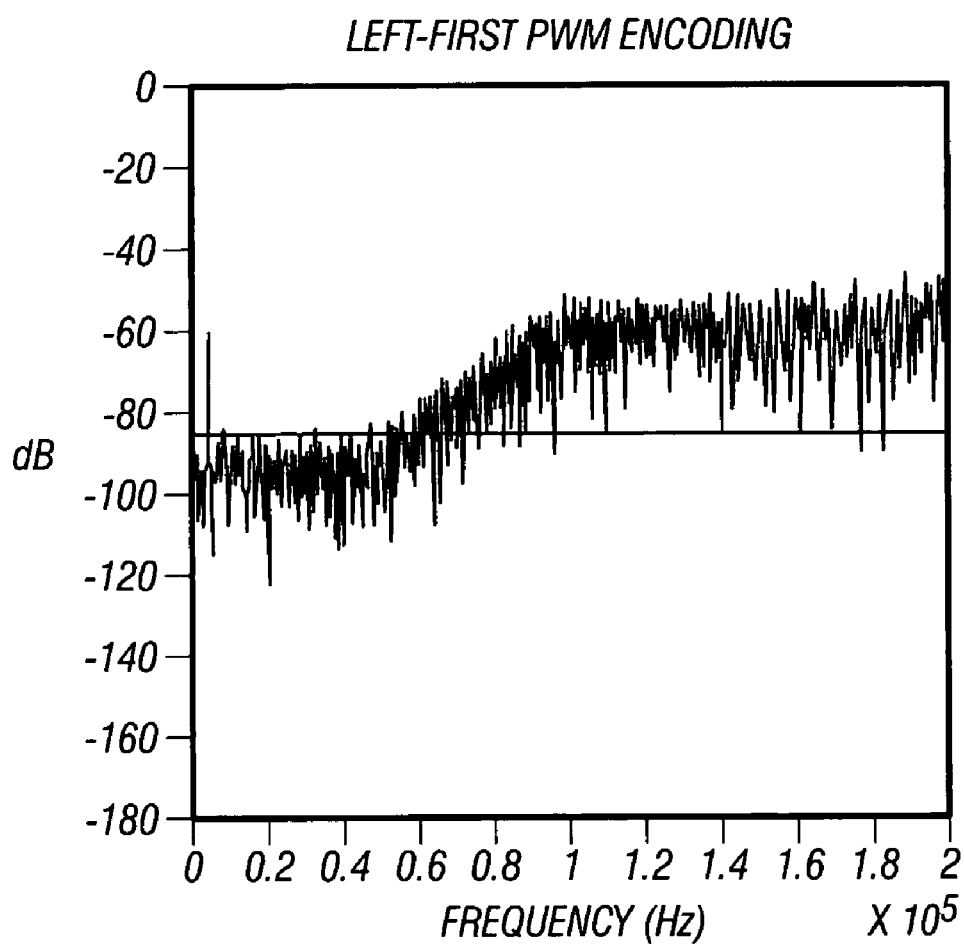
FIG. 7C is a noise power versus frequency plot illustrating an improvement in the output noise floor in a digital to analog converter utilizing edge balancing according to one embodiment of the principles of the present invention.
Figure 7D:
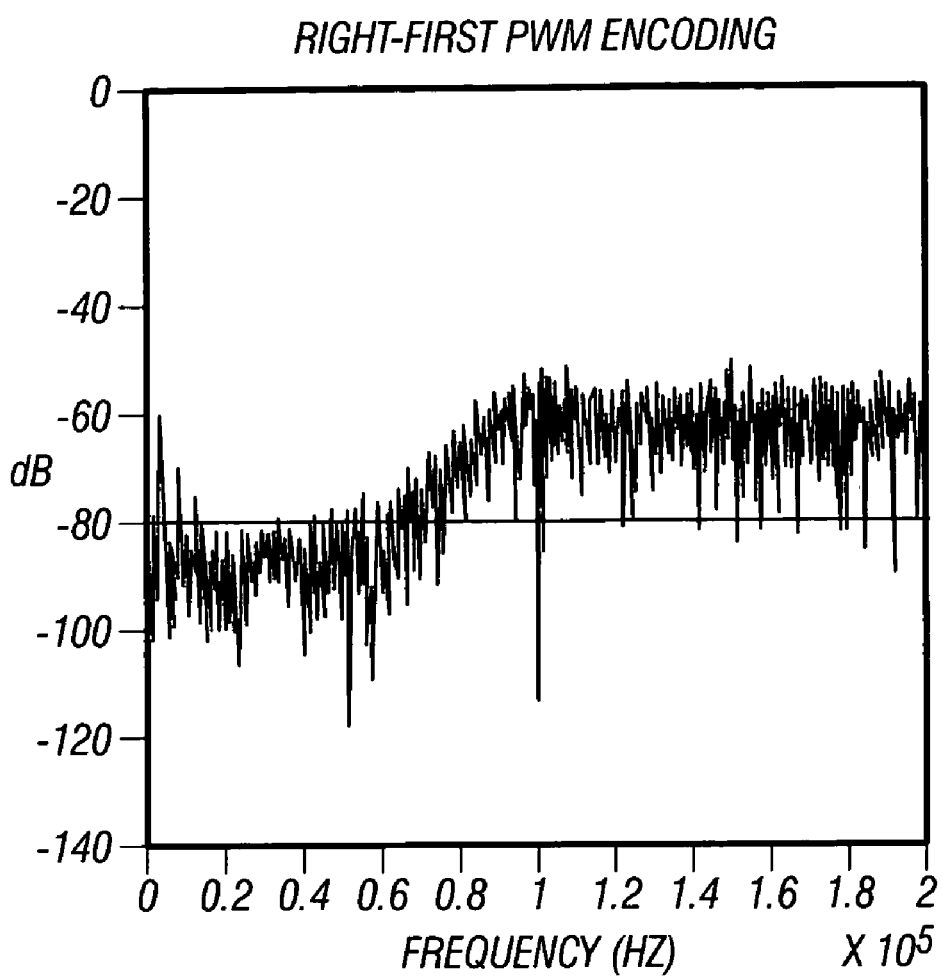
FIG. 7D is a noise power versus frequency plot illustrating an improvement in the output noise floor in a digital to analog converter utilizing edge balancing according to another embodiment of the principles of the present invention.

Depending on the distribution in time of late and early edges at the PWM encoder outputs, the resulting interference spectrum in the analog summer output will differ. For example, FIG. 7C depicts the noise power versus frequency spectrum from the output in a single PWM driving a single element system applying a left-first encoding scheme to a −60 dB delta-sigma modulated input signal. FIG. 7D illustrates the case in which the same system applies a right-first encoding scheme to the same input signal. In FIG. 7D, the noise floor is approximately −80 dB, while in FIG. 7C, the noise floor improves (lowers) to approximately −85 dB.

In the example of digital audio system 100 of FIG. 1, for a given PWM stage 104a–104N, PWM encoder 110a selectively switches DAC elements 111a–111x in the following FIR filter 105a–105N in response to the output of delta-sigma modulator 102, while PWM encoder 110b selectively switches DAC elements 111a–111X in the following FIR filter 106a–106N. The outputs from DAC elements 111a–111X, including noise caused by interference at the switching edges, is summed into summer 107 and into the analog output. This problem of switching noise in the analog output is independent of whether PWM stages 104a–104N and/or PWM encoders 110a–110N operate in a de-interleaved fashion, as shown in the illustrated embodiment of FIG. 1, or operate in parallel from corresponding parallel outputs of the multiple-bit quantizer of delta-sigma modulator 102, in alternate embodiments.

According to the principles of the present invention, the early and late characteristics of the + and − patterns from each PWM stage 104a–104N are balanced to reduce noise in the ultimate analog output. Specifically, by balancing the relationship between the edges switching DAC elements 111a–111X of FIR filters 105a–105N and 106a–106N, the interference noise spectrum is varied to lower the noise floor.

Figure 8A:
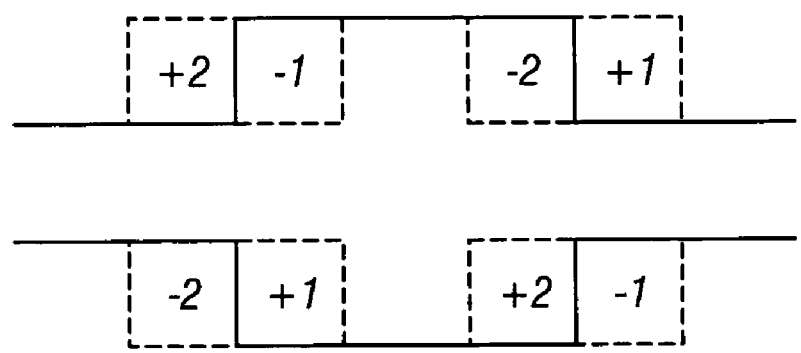
FIGS. 8A and 8B are diagrams respectively illustrating exemplary right-first, left-first and right-first, right-first techniques for generating first and second pulse width modulation patterns from the ternary pulse width modulation stages shown in FIG. 1.
Figure 8B:
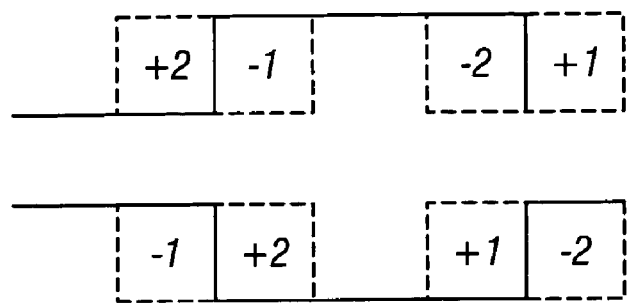

In one embodiment, either the right-first or left-first technique is used exclusively, as chosen to produce the best performance based on the early-late edge characteristics. FIGS. 8A and 8B illustrate two such exemplary PWM output codings for an exemplary pair of PWM encoders 110a–110N of a corresponding PWM stage 104a–104N. Specifically, in FIG. 8A, the + pattern grows on the right first, since one active slot is first added (+1) on the right side and the − pattern then grows left, since the first active slot added (+1) is added on the left side. The next addition of an active slot to the + pattern then occurs on the left (+2) and the next addition to the − pattern occurs on the right (+2). For subtraction of slots, the opposite is implemented. For example, the first slot taken from the left of the + pattern (−1) and the first slot taken from the − pattern is taken from the right (−1). In the case shown in FIG. 8A, adding or subtracting a single active slot to either the + or bottom − patterns results in a late edge.

In FIG. 8B, both the + and −PWM output patterns grow right first, in the case of the addition of active slots. Here, adding or subtracting a single active slot to either the + or − patterns results in either an early or late edge, depending on whether the associated mismatch shaper 109a–109N chooses the top or bottom pattern.

By controlling the location of the edges of the + and − patterns output from each PWM stage 104a–104N by choosing to vary the pattern in a right first or a left first manner, the switching spectrum into downstream analog circuits is varied. In particular, by controlling the early and late edges, very different 'edge spectrums' are obtained, as discussed above.

Figure 9A:
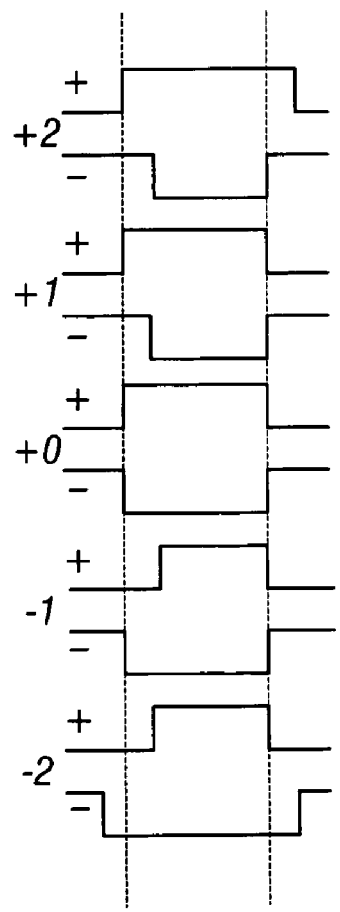
FIGS. 9A and 9B are diagrams respectively showing exemplary techniques for implementing edge balancing in ternary pulse width modulated signals according to the principles of the present invention.
Figure 9A:
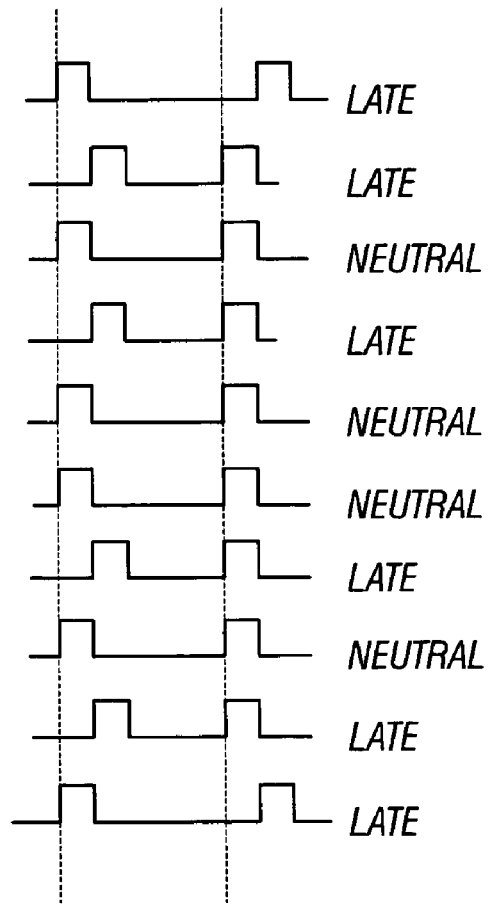

FIG. 9A shows a "right-first, left-first" example in which the PWM and − outputs, of a selected PWM stage 104a–104N of FIG. 1, and the edge spectrum for variation in the input sample value ranges from −2 to +2, and the first active slot added to +PWM pattern is added on the right and the first active edge added to the − pattern is added on the left. The corresponding mismatch shaper 109 is outputting a logic zero, such that additions start with the − pattern first. For subtractions of active slots from neutral in this example, the first slot subtracted from the + pattern is subtracted on the left, and from the − pattern is subtracted from the right.

This PWM encoding forms the PWM pattern of the 0, +/−1 and +/−2 modulator output levels by making all the edges late in a predictable and consistent pattern.

Figure 9B:
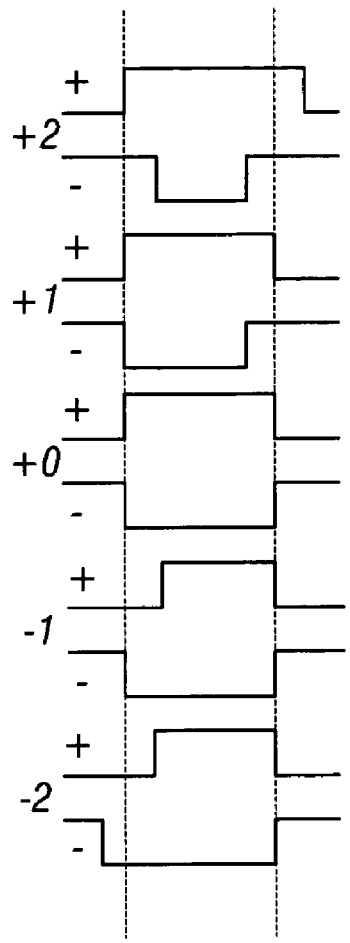
Figure 9B:
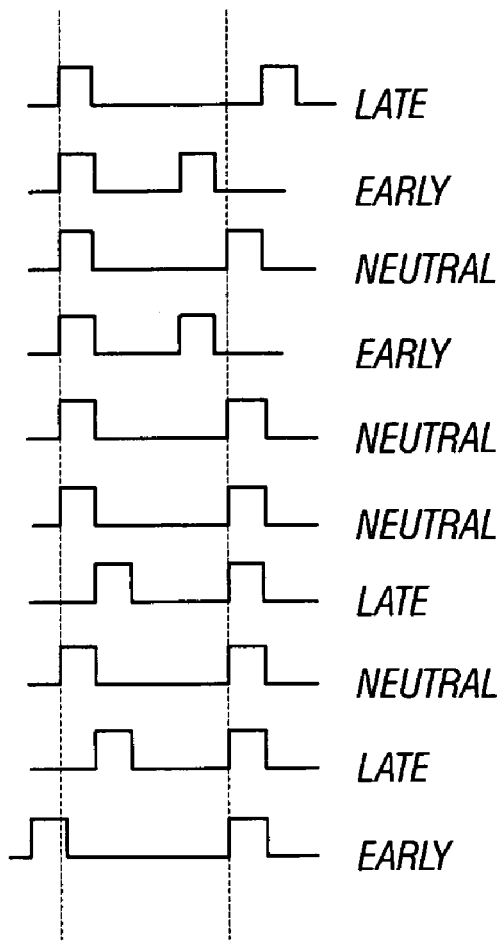

FIG. 9B shows the corresponding PWM outputs and the edge spectrum for variations in the input sample value from −2 to +2 for a "right-first, right-first" case, again with the corresponding mismatch shaper 109 outputting a logic zero. Here, addition of active slots is implemented first on the right side for both the + and − patterns. Subtraction of active slots is implemented on the left side for both the + and − patterns. This particular PWM encoding forms the PWM pattern of the 0, +/−1 and +/−2 modulator outputs by generating both early and late patterns. Specifically as the input samples progress from 0 to +1 to +2, an early edge is added, followed by the addition of a late edge. (In the case in which the corresponding mismatch shaper is forced to 1, the process reverses by adding an early edge and then a late edge).

Figure 10:
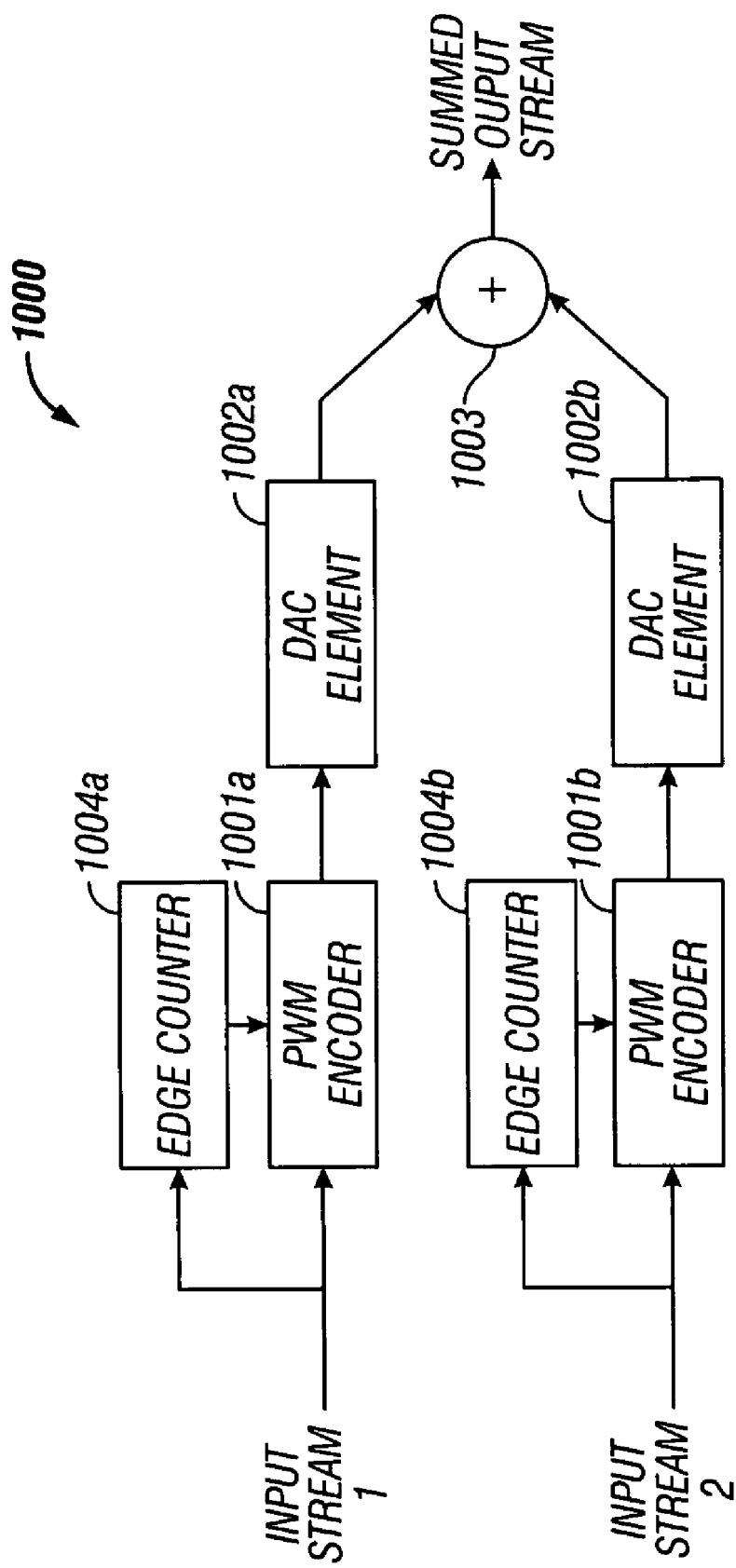
FIG. 10 is a block diagram illustrating a general digital to analog conversion system utilizing pulse width modulation stages and associated edge balancing circuitry according to the principles of the present invention.

According to another embodiment of the inventive principles, the early and late edges are tracked and active slots then added or subtracted in either a grow left or a grow right fashion such that number of early and late edges generated over a stream of input samples is approximately equal. This embodiment is illustrated in FIG. 10 for a general system 1000 including two PWM encoders 1001a–1001b driving two DAC elements 1002a–1002b into an analog output summer 1003. In this example, counters 1004a–1004b track the number of early and late edges previously generated by each PWM encoder 1001a–1001b and control the generation of the next late and early edges being output by PWM encoders 1001a–1001b. In alternate embodiments, a global counter is used to count the early and late edges of the outputs from both PWM encoders 1001a–1001b.

Figure 11:
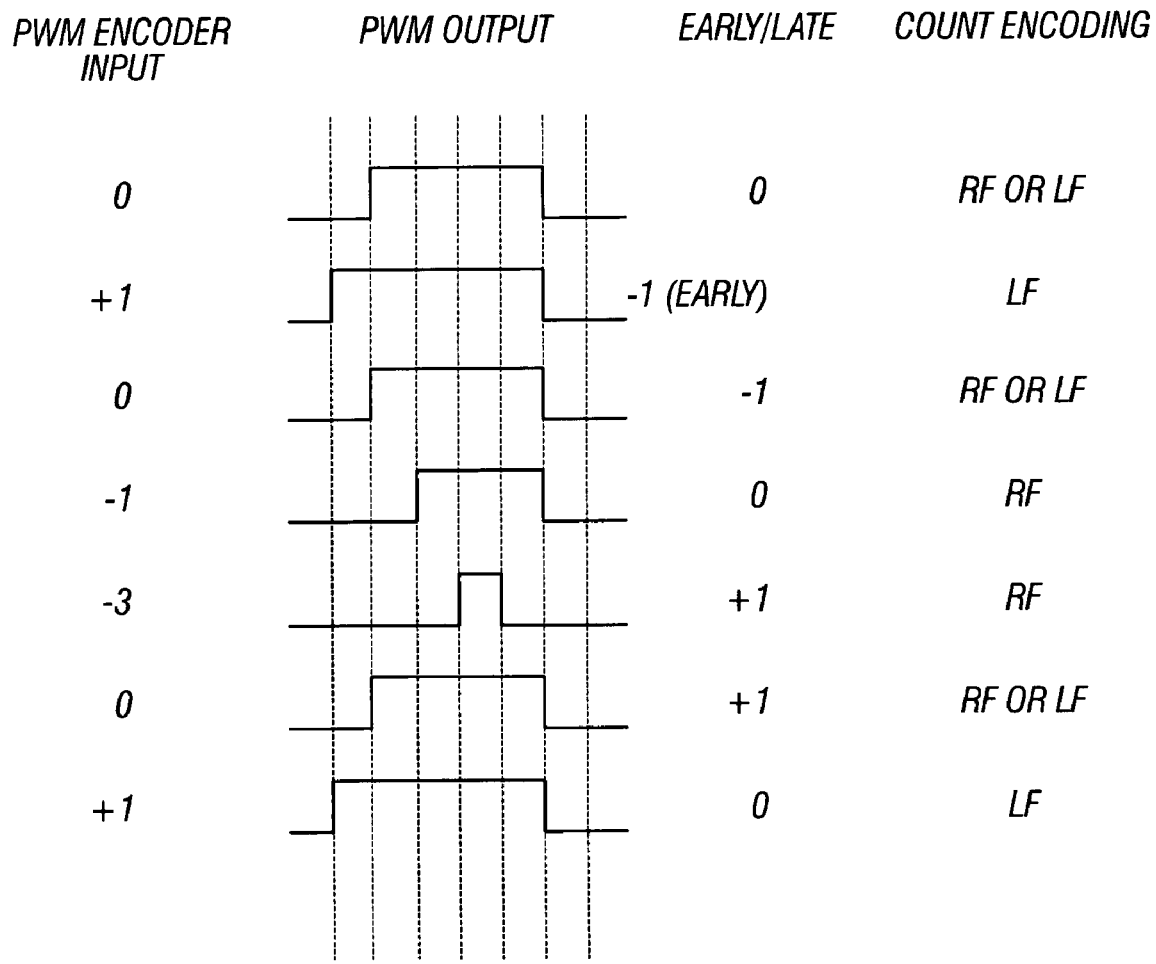
FIG. 11 is a timing diagram illustrating exemplary operations of the general digital to analog conversion system shown in FIG. 10.

One possible edge balancing algorithm suitable for performing edge balancing in system 1000 is illustrated in FIG. 11. This exemplary edge balancing algorithm ensures that the number of early and late PWM edges generated by PWM encoders 1001a and 1001b for the corresponding input stream are approximately equal by ensuring that the count in the corresponding counter 1004a or 1004b, on the average, swings around a neutral value. For example, in the illustrated embodiment of general system 1000, the neutral count value is selected to be a count of zero, each late edge generated by a PWM stage 1001a–1001b increments the corresponding counter 1004a–1004b by one (+1), and each early edge generated by a PWM stage 1001a–1001b decrements the corresponding counter 1004a–1004b by one (−1). The current count value in each counter 1004a–1004b then forces the associated PWM encoder 1001a–1001b to generate the next PWM pattern using the right-first or left-first variation technique which will generate the early or late edge necessary to bring the corresponding counter value back to zero (0).

Figure 12:
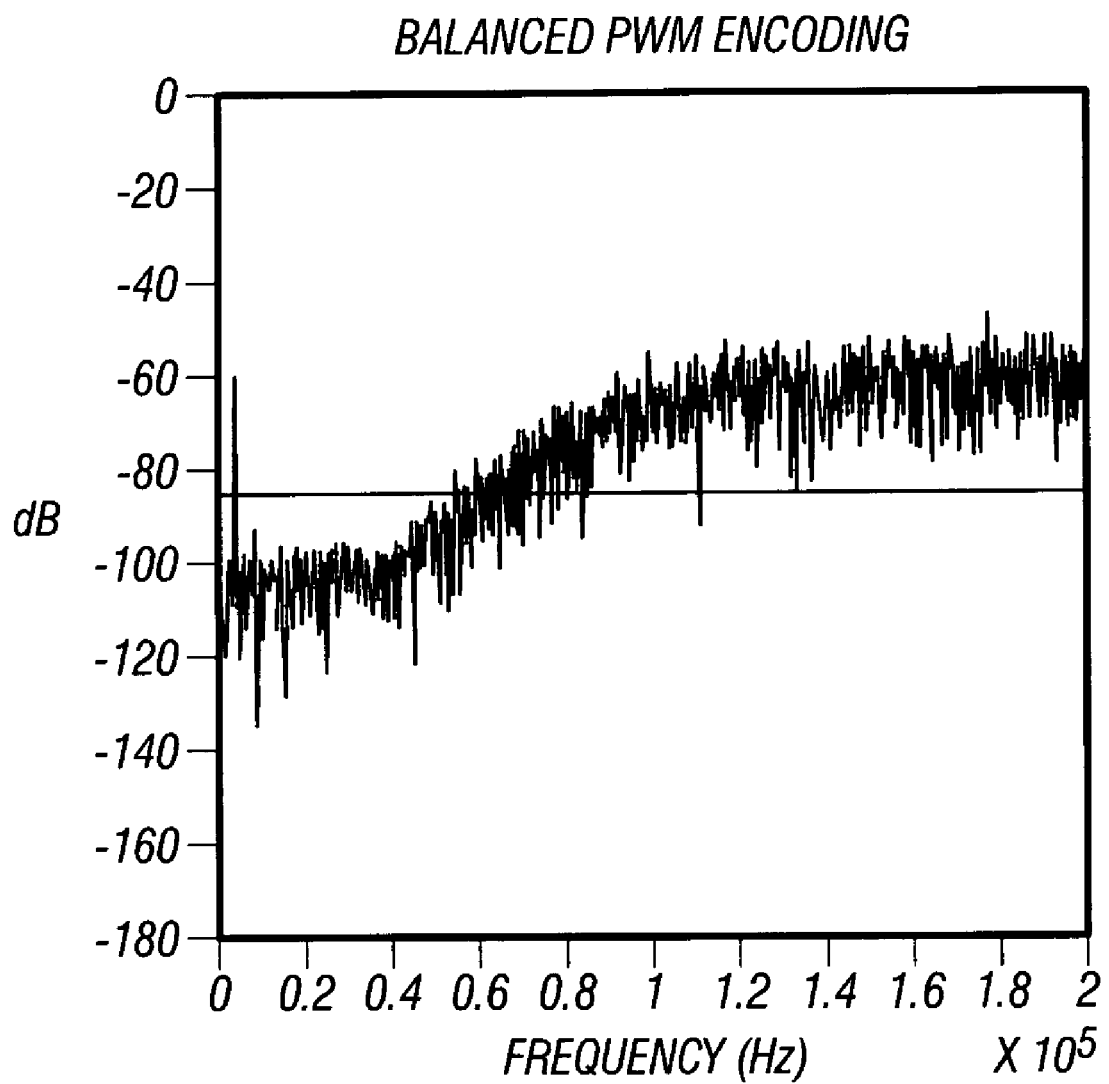
FIG. 12 is a noise power versus frequency plot illustrating an exemplary improved noise floor provided by the general digital to analog conversion system described in FIGS. 10 and 11.

The improved output response provided by application of the present inventive principles embodied in general system 1000 of FIG. 10 are illustrated in FIG. 12. Advantageously, the noise floor is lowered by at least 10 dB, relative to the exemplary plots shown in FIGS. 7C and 7D.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of performing digital to analog conversion comprising:
   generating a pulse width modulated data stream and another pulse width modulated data stream including generating encoding patterns of the pulse width modulated data stream by selectively generating early and late pattern edges relative to edges of a reference such that the encoding patterns of the pulse width modulated data stream minimize distortion in the another pulse width modulated stream caused by edges in the pulse width modulated data stream, and wherein selectively generating early and late pattern edges comprises:
   tracking a number of early and late edges generated in previously generated encoding patterns; and
   selectively generating a late or early edge in at least one subsequent encoding pattern such that an average number of early edges in the pulse width modulated data stream approximates an average number of late edges in the pulse width modulated data stream;
   converting in corresponding digital to analog conversion elements the pulse width modulated data stream and the another pulse width modulated data stream into an analog signal and another analog signal; and
   summing the analog signal and the another analog signal to generate an output signal.

2. The method of claim 1, wherein selectively generating early and late pattern edges comprises selectively varying right and left pattern edges in the encoding patterns relative to corresponding left and right edges in the reference pattern.

3. The method of claim 1, wherein generating the pulse width modulated data stream and the another pulse width modulated data stream comprises generating first and second pulse width modulated data streams together encoding a single input stream.

4. A method of performing digital to analog conversion comprising:
   generating a pulse width modulated data stream and another pulse width modulated data stream including generating encoding patterns of the pulse width modulated data stream by selectively generating early and late pattern edges relative to edges of a reference pattern such that the encoding patterns of the pulse width modulated data stream minimize distortion in the another pulse width modulated stream caused by edges in the pulse width modulated data stream, wherein selectively generating early and late pattern edges comprises:
   varying a count in a counter from a neutral count value in response to a late or early edge in selected encoding patterns generated; and
   generating a late or early edge in a subsequent encoding pattern which varies the count in the counter towards the neutral count value;
   converting in corresponding digital to analog conversion elements the pulse width modulated data stream and the another pulse width modulated data stream into an analog signal and another analog signal; and summing the analog signal and the another analog signal to generate an output signal.

5. A method of performing digital to analog conversion comprising:
generating a pulse width modulated data stream and another pulse width modulated data stream including generating encoding patterns of the pulse width modulated data stream by selectively generating early and late pattern edges relative to edges of a reference pattern such that the encoding patterns of the pulse width modulated data stream minimize distortion in the another pulse width modulated stream caused by edges in the pulse width modulated data stream, wherein a number of early pattern edges is approximately equal to a number of late pattern edges generated in the pulse width modulated data stream;
converting in corresponding digital to analog conversion elements the pulse width modulated data stream and the another pulse width modulated data stream into an analog signal and another analog signal; and
summing the analog signal and the another analog signal to generate an output signal.

6. A method of performing digital to analog conversion comprising:
generating a pulse width modulated data stream and another pulse width modulated data stream including generating encoding patterns of the pulse width modulated data stream by selectively generating early and late pattern edges relative to edges of a reference pattern such that the encoding patterns of the pulse width modulated data stream minimize distortion in the another pulse width modulated stream caused by edges in the pulse width modulated data stream, wherein a number of late pattern edges substantially exceeds a number of early pattern edges generated in the pulse width modulated data stream;
converting in corresponding digital to analog conversion elements the pulse width modulated data stream and the another pulse width modulated data stream into an analog signal and another analog signal; and
summing the analog signal and the another analog signal to generate an output signal.

7. A digital to analog conversion system comprising:
pulse width modulation circuitry for generating first and second pulse width modulated data streams, encoding patterns of the first pulse width modulated data stream selected to minimize distortion in the second pulse width modulated stream caused by edges in the first pulse width modulated data stream and wherein the pulse width modulation circuitry generates the encoding patterns of the first data stream by generating early and late pattern edges relative to edges of a reference pattern and is operable to
track a number of early and late edges generated in previously generated encoding patterns in the first pulse width modulated data streams and
selectively generate a late or early edge in at least one subsequent encoding pattern in the first pulse width modulated data stream such that an average number of early edges approximates an average number of late edges;
first and second digital to analog conversion elements for respectively converting the first and second the first and second analog signals to generate the analog output signal.

8. The digital to analog conversion system of claim 7, wherein the pulse width modulation circuitry comprises a ternary pulse width modulation stage.

9. The digital to analog conversion system of claim 7, the pulse width modulation circuitry generates early and late pattern edges by selectively varying right and left pattern edges in the encoding patterns relative to corresponding left and right edges in the reference pattern.

10. The digital to analog converter of claim 7, wherein the first and second digital to analog conversion elements comprise continuous-time digital to analog conversion elements.

11. A digital to analog conversion system comprising:
pulse width modulation circuitry for generating first and second pulse width modulated data streams, encoding patterns of the first pulse width modulated data stream selected to minimize distortion in the second pulse width modulated stream caused by edges in the first pulse width modulated data stream and wherein the pulse width modulation circuitry generates the encoding patterns of the first data stream by generating early and late pattern edges relative to edges of a reference pattern and comprises:
a counter counting from a neutral count value in response to a late or early edge in selected encoding patterns generated in the first pulse width modulated stream; and
circuitry causing generation of a late or early edge in a subsequent encoding pattern which varies the count in the counter towards the neutral count value; and
first and second digital to analog conversion elements for respectively converting the first and second the first and second analog signals to generate the analog output signal.

12. The digital to analog converter of claim 11, wherein the neutral count value is zero, the counter increments by a selected value in response to an early edge and decrements by the selected amount in response to an late edge.

13. An digital to analog conversion system comprising:
a noise shaper for requantizing a digital input data stream;
pulse width modulation circuitry for generating first and second pulse width modulated data streams in response to the output of the noise shaper, encoding patterns of the first pulse width modulated data stream selected to minimize distortion in the second pulse width modulated stream caused by edges in the first pulse width modulated data stream, and wherein the pulse width modulation circuit generates the encoding patterns of the first data stream by generating early and late pattern edges relative to edges of a reference pattern and is operable to:
track a number of early and late edges generated in previously generated encoding patterns in the first pulse width modulated data stream; and
selectively generate a late or early edge in at least one subsequent encoding pattern in the first pulse width modulated data stream such that an average number of early edges approximates an average number of late edges; and
first and second digital to analog conversion elements for respectively converting the first and second pulse width modulated data streams into first and second analog signals; and
an analog summer for summing the first and second analog signals to generate the analog output signal.

14. The digital to analog conversion system of claim 13, wherein the pulse width modulation circuitry comprises a first encoder for generating the first pulse width modulated data stream and a second encoder for generating the second pulse width modulated data stream, the first and second encoders encoding an input stream from the noise shaper such that first and second pulse width modulated streams together encode the input stream.

15. The digital to analog conversion system of claim 13, wherein the first and second encoders operate respectively on first and second input streams output from the noise shaper.

16. The digital to analog conversion system of claim 15, further comprising deinterleaving circuitry for switching the first and second input streams output from the noise shaper respectively to the first and second encoders.

17. The digital to analog conversion system of claim 13, wherein the first and second digital to analog conversion elements comprises elements of a digital filter.

* * * * *

UNITED STATES PATENT AND TRADEMARK OFFICE
CERTIFICATE OF CORRECTION

PATENT NO. : 6,965,335 B1  
DATED : November 15, 2005  
INVENTOR(S) : Brian David Trotter, Bruce Duewer and Laurence Melanson It is certified that error appears in the above-identified patent and that said Letters Patent is hereby corrected as shown below:

Column 12,
Line 58, after "PWM" (first occurrence) insert -- + --.

Signed and Sealed this

Fourth Day of April, 2006

JON W. DUDAS
*Director of the United States Patent and Trademark Office*